United States Patent
Park et al.

(10) Patent No.: US 7,863,878 B2
(45) Date of Patent: Jan. 4, 2011

(54) VOLTAGE REGULATOR FOR WRITE/READ ASSIST CIRCUIT

(75) Inventors: Heechoul Park, San Jose, CA (US); Xiaozhen Guo, Sunnyvale, CA (US); Jungyong Lee, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 262 days.

(21) Appl. No.: 12/194,452

(22) Filed: Aug. 19, 2008

(65) Prior Publication Data
US 2010/0045249 A1    Feb. 25, 2010

(51) Int. Cl.
G05F 1/44    (2006.01)
G05F 1/56    (2006.01)

(52) U.S. Cl. .................. 323/282; 323/284; 323/285; 323/286; 323/222; 323/234

(58) Field of Classification Search ............ 323/282, 323/284, 285, 286, 222, 234
See application file for complete search history.

(56) References Cited

U.S. PATENT DOCUMENTS

| | | | |
|---|---|---|---|
| 2004/0100235 A1* | 5/2004 | Lee | 323/282 |
| 2005/0088158 A1* | 4/2005 | Horiguchi et al. | 323/282 |
| 2005/0134242 A1* | 6/2005 | Gradinariu | 323/282 |
| 2009/0303819 A1* | 12/2009 | Park et al. | 365/203 |

* cited by examiner

Primary Examiner—Bao Q Vu
(74) Attorney, Agent, or Firm—Martine Penilla & Gencarella, LLP

(57) ABSTRACT

A push-pull voltage regulator configured to selectively provide power to used portions of a memory array is presented. The push-pull voltage regulator includes a voltage-up regulator, which provides a reference voltage to an SRAM array, and a voltage-down regulator, which controls removal of excess charge from the SRAM array. The voltage-down regulator consists of a plurality of amplifier stages with a plurality of inputs, a plurality of inverters, a gain amplifier, a biasing transistor, and a NMOS drainage transistor. The gate terminal of the NMOS drainage transistor is coupled to an output of the voltage-down regulator. A first output terminal of the NMOS drainage transistor coupled to an output node of the push-pull voltage regulator and a second output terminal of the NMOS drainage transistor coupled to ground. When activated, the NMOS drainage transistor transfers excess charge from the SRAM array to ground.

20 Claims, 5 Drawing Sheets

US 7,863,878 B2

VOLTAGE REGULATOR FOR WRITE/READ ASSIST CIRCUIT

BACKGROUND OF THE INVENTION

For SRAM cells in general, static noise margin (SNM) and Vtrip are interdependent and design techniques that improve SNM, tend to degrade Vtrip and vice-versa. For example, the SNM can be improved by decreasing the voltage on the bitline, which weakens the passgate transistor. The SNM improves linearly with decreasing bitline voltage until the bitline voltage is about equal to the threshold voltage of the passgate transistor. In similar fashion, the voltage of the SRAM cell can be varied to improve the performance of the SRAM circuit.

These methods often involve using dual voltages for either read or write operations to improve cell margin. In most cases, a particular voltage is used in most operation states, but switching voltage when it is most advantageous. Implementation of a dual voltage SRAM circuit, requires providing a well regulated voltage for proper operation of the SRAM circuit and means to remove excess charge built up in SRAM circuit so the proper voltage can be maintained before the next operation state.

As a result, there is a need to solve the problems of the prior art to provide a method and apparatus for maintaining the proper voltage and removing excess charge built up in the SRAM circuit.

SUMMARY OF THE INVENTION

Broadly speaking, the present invention fills these needs by providing a method and apparatus for voltage regulation and removal of excess charge from an SRAM array. It should be appreciated that the present invention can be implemented in numerous ways, including as a method, a system, or a device. Several inventive embodiments of the present invention are described below.

In accordance with one aspect of the invention, a push-pull voltage regulator configured to provide well regulated voltage, as well as remove excess charge from the SRAM array is provided. The push-pull voltage regulator includes a voltage-up regulator, which provides a reference voltage to an SRAM array. The voltage-up regulator has a plurality of inputs, an amplifier stage and a biasing transistor, with a reference voltage source coupled to a first input of the voltage-up regulator. The push-pull voltage regulator further includes a voltage-down regulator, which controls removal of excess charge from the SRAM array. In one embodiment, the voltage-down regulator consists of a plurality of amplifier stages with a plurality of inputs, a plurality of inverters, a gain amplifier, a biasing transistor, and a NMOS drainage transistor. The gate terminal of the NMOS drainage transistor is coupled to an output of the voltage-down regulator. A first output terminal of the NMOS drainage transistor coupled to an output node of the push-pull voltage regulator and a second output terminal of the NMOS drainage transistor coupled to ground. When activated, the NMOS drainage transistor transfers excess charge from the SRAM array to ground.

In accordance with another aspect of the invention, a method for voltage regulation and removing excess charge from an SRAM array is detailed. A reference voltage is received at a first input of a voltage-up regulator. The reference voltage is provided to the SRAM array through the voltage-up regulator. A feedback voltage from an output node of a push-pull voltage regulator is received at a second input of the voltage-up regulator. A voltage regulation state for the SRAM array is maintained using the feedback voltage from the output node of the push-pull voltage regulator. A voltage-down regulator receives an output from an offset voltage source at a first input and a feedback voltage from the output node of a push-pull voltage regulator at a second input. The voltage-down regulator controls a discharge operation state of the push-pull voltage regulator.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

The following embodiments describe an apparatus and method for voltage regulation and excess charge removal in an SRAM circuit. It will be obvious, however, to one skilled in the art, that the present invention may be practiced without some or all of these specific details. In other instances, well known process operations have not been described in detail in order not to unnecessarily obscure the present invention.

Figure 1:
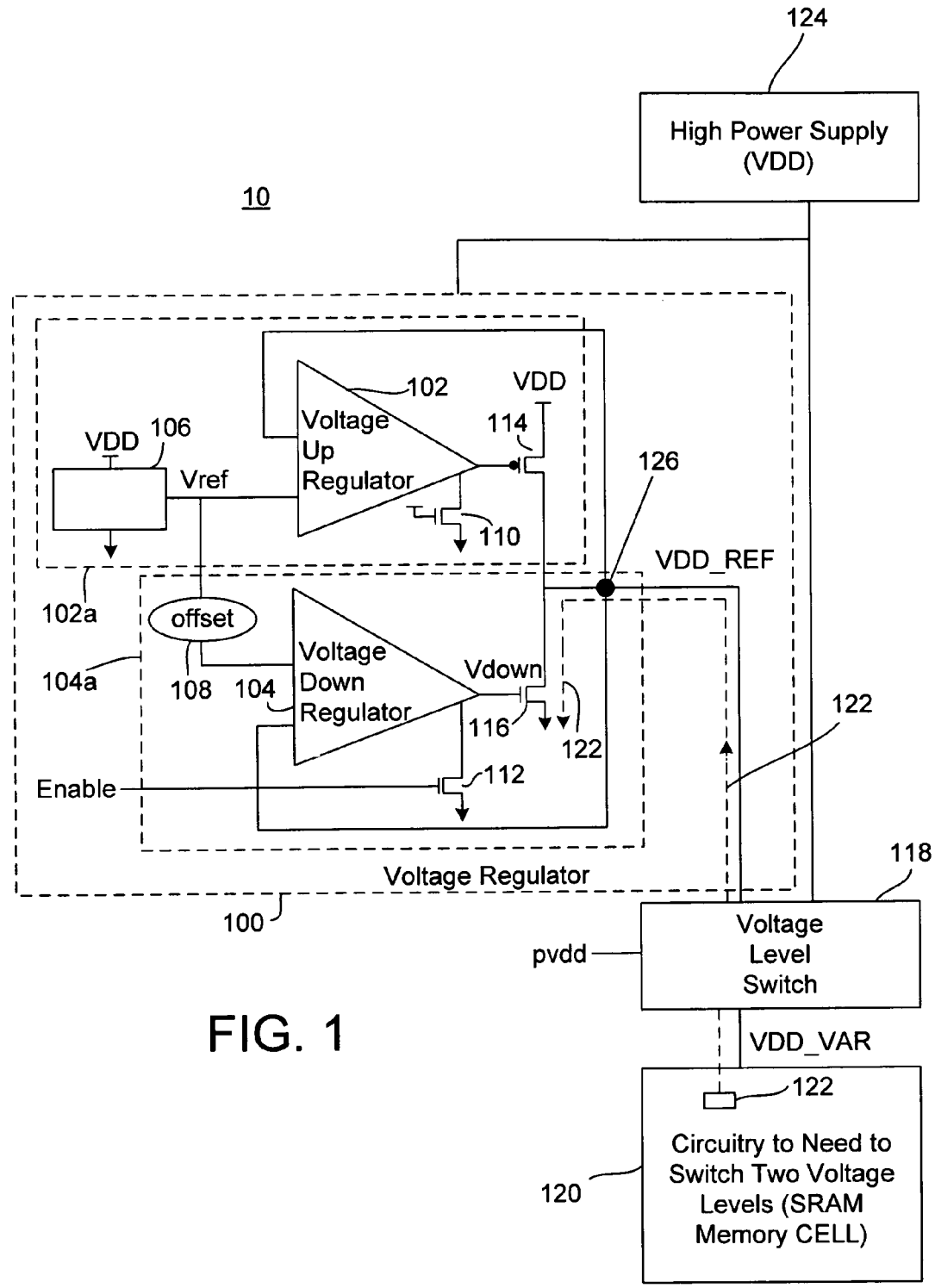
FIG. 1 illustrates an SRAM circuitry utilizing a push-pull voltage regulator in accordance with one embodiment of the present invention.

FIG. 1 illustrates an SRAM circuit 10 utilizing a push-pull voltage regulator in accordance with one embodiment of the present invention. As illustrated in FIG. 1, the SRAM circuit 10 consists of an SRAM array 120, a push-pull voltage regulator 100, and a voltage level switch 118. The push-pull regulator 100 provides a reference voltage to the SRAM array 120 and removes excess charge from the SRAM array 120. The push-pull voltage regulator 100 has two distinct operating states: a voltage maintenance state, and a discharge operating state.

The voltage level switch 118 couples the output node 126 of the push-pull voltage regulator 100 to the SRAM array 120. The voltage level switch 118 receives the voltage (VDD_REF) from the output node 126 of the push-pull voltage regulator 100 as well as a high voltage power supply as inputs. The voltage level switch 118 functions to provide either the voltage (VDD_REF) of the output node 126 of the push-pull voltage regulator 100 or the high power supply (VDD) 124 to the SRAM array 120 depending on the operation of the SRAM circuit 10. The switching function of the voltage level switch 118 is controlled by a pvdd input.

The push-pull voltage regulator 100 can be separated into two portions, a voltage maintenance portion 102*a* and discharge operation portion 104*a* based on the operating state of the push-pull voltage regulator 100. A first operating state of the push-pull voltage regulator 100 is a voltage regulation state defined to provide the output (Vref) of a reference voltage source 106 to the SRAM array 120. The voltage regulation portion 102a contains the reference voltage source 106, a voltage-up regulator 102, a biasing transistor 110 for the voltage-up regulator 102, and a p-type metal oxide semiconductor (PMOS) passgate 114. The output (Vref) of the reference voltage source 106 is provided to a first input of the voltage-up regulator 102 and the second input of the voltage-up regulator 102 is coupled to the output node 126 of the push-pull voltage regulator 100. The voltage-up regulator 102 accurately provides the output (Vref) of the reference voltage source 106 and maintains this voltage (VDD_REF) at the output node 126 of the push-pull voltage regulator to the SRAM array 120.

The discharge operation portion 104a of the push-pull regulator 100 contains the elements is used for a discharge operation state. The discharge operation state is defined to remove excess charge 122 from the SRAM circuit 120 by a voltage-down regulator 104 when the voltage (VDD_REF) of the output node 126 of the push-pull voltage regulator 100 is above a threshold voltage and the voltage-down regulator 104 receives an enable input signal. The discharge operation portion 104a of the push-pull voltage regulator includes a voltage-down regulator 104, a plurality of biasing transistors 112 and 112' for the voltage-down regulator 104, an offset voltage source 108, and a n-type metal oxide semiconductor (NMOS) drainage transistor 116. Of the plurality of the biasing transistors 112 and 112' for the discharge operation portion, only one of the plurality of biasing transistors 112 is shown for clarity. Excess charge 122 from the SRAM array 120 is removed through the voltage level switch 118 and the NMOS drainage transistor 116 to ground. The operation of the NMOS drainage transistor 116 is controlled by the output voltage (Vdown) of the voltage-down regulator 104.

Figure 2:
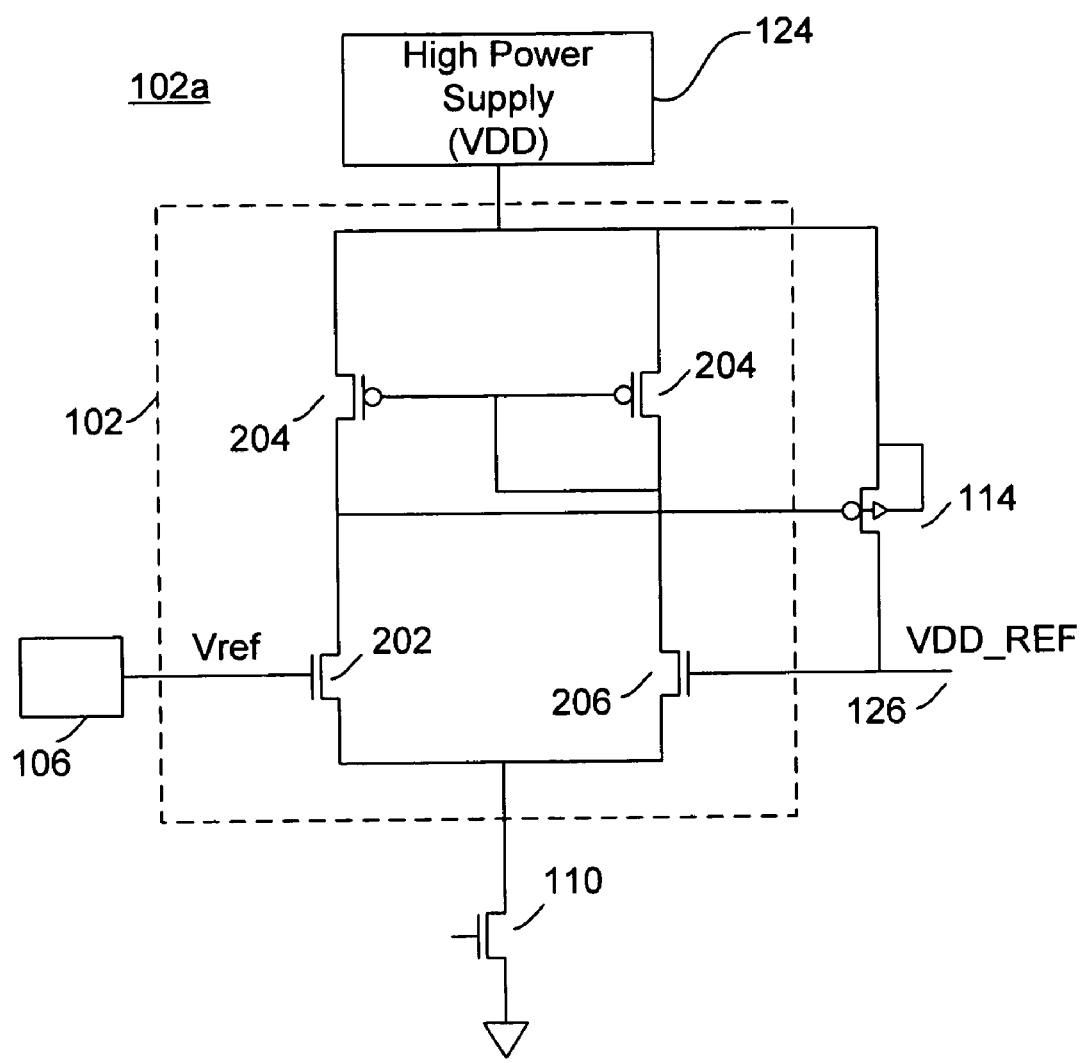
FIG. 2 illustrates the voltage maintenance portion of the push-pull voltage regulator in accordance with one embodiment of the present invention.

FIG. 2 illustrates the voltage maintenance portion of the push-pull voltage regulator in accordance with one embodiment of the present invention. Power to the voltage-up regulator 102 is provided by high power supply (VDD) 124. The voltage-up regulator 102 has a biasing transistor 110, which determines the amount of current used by the voltage-up regulator 102 and thus the speed of the voltage-up regulator 102. In one embodiment, the biasing transistor 110 of the voltage-up regulator is biased for low current operation. The gate terminal of the PMOS passgate 114 is coupled to the output of the voltage-up regulator 102. An output terminal of the PMOS passgate 114 is coupled to the output node 126 of the push-pull voltage regulator.

In another embodiment, the voltage-up regulator 102 is a current mirror with the reference voltage source 106 coupled to a first input 202 of the voltage-up regulator 102 and the output node 126 of the push-pull voltage regulator coupled to a second input 206 of the voltage-up regulator. The voltage difference between the first input 202 and the second input 206 of the voltage-up regulator 102 serves to maintain the voltage (VDD_REF) at the output node 126 of the push-pull voltage regulator. If the voltage (VDD_REF) at the output node 126 is lower than the output (Vref) from the reference voltage source 106, the current of the first input transistor 202 is higher than the current of the second input transistor 206. An increase of current in the first input transistor 202 reduces the voltage on the gate terminal of the PMOS passgate 114, which in turn increases the voltage (VDD_REF) on the output node 126 of the push-pull voltage regulator.

Conversely, if the voltage at the output node (VDD_REF) 126 is higher than the output (Vref) from the reference voltage source 106, the current of the first input transistor 202 is lower than the current of the second input transistor 206. A decrease of current in the first input transistor 202 increases the voltage on the gate terminal of the PMOS passgate 114, which in turn decreases the voltage (VDD_REF) on the output node 126 of the push-pull voltage regulator.

In this way, variations of the voltage on the output node 126 of the push-pull regulator is self-regulating and corrects itself to maintain the output (Vref) of the reference voltage source 106 on the output node 126.

Although a specific transistor configuration was used to illustrate one embodiment of the voltage maintenance portion 102a of the push-pull voltage regulator, one with skill in the art will appreciate other transistor configurations can be used so long as the essential functions of accurately providing and maintaining the reference voltage (Vref) to the SRAM array 120 are maintained.

Figure 3:
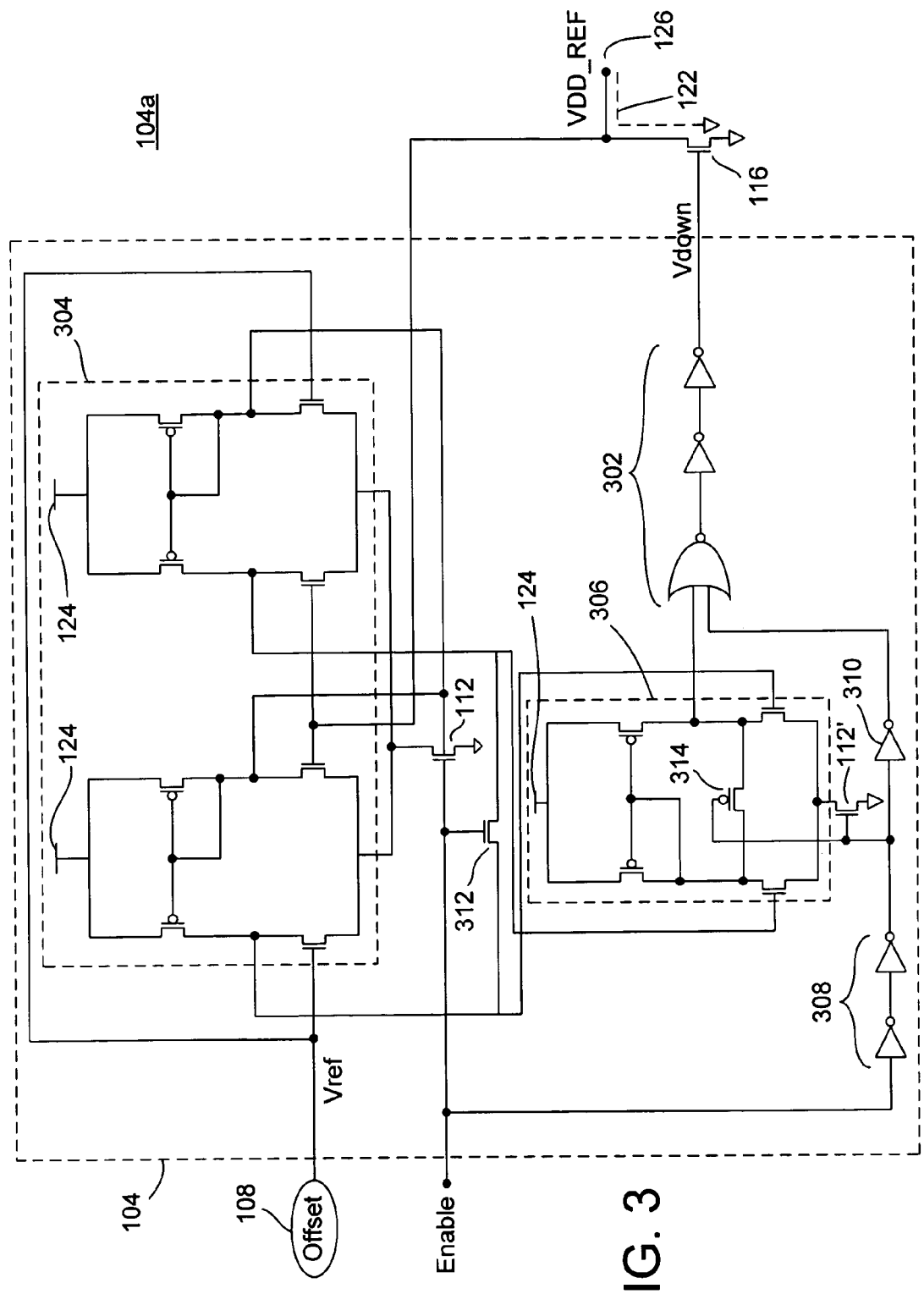
FIG. 3 illustrates the discharge operation portion of the push-pull voltage regulator in accordance with one embodiment of the present invention.

FIG. 3 illustrates the discharge operation portion of the push-pull voltage regulator in accordance with one embodiment of the present invention. Power to the voltage-down regulator 102 is provided by high power supply (VDD) 124. The discharge operation portion 104a of the push-pull voltage regulator removes excess charge from the SRAM array when the voltage provided to the SRAM array transitions from a high power supply to a low power supply. The discharge operation portion 104a of the push-pull voltage regulator includes a voltage-down regulator 104, an offset voltage source 108 and a NMOS drainage transistor 116.

In one embodiment, the voltage-down regulator 104 includes a plurality of current mirror amplifier stages 304 and 306 with an additional gain amplifier 302. The first stage 304 of current mirror amplifiers includes two current mirror amplifiers with a biasing transistor 112. An offset voltage source 108 is coupled between the output (Vref) of the reference voltage source and a first input of the first current mirror amplifier stage 304 of the voltage-down regulator 104. The offset voltage source 108 in addition to the reference voltage source provides a voltage approximately equal to the sum of the output (Vref) of the reference voltage source and the output of the offset voltage source 108 on the first input of the first current mirror amplifier stage 304. A second input of the first current mirror amplifier stage 304 receives the voltage (VDD_REF) of the output mode 126 of the push-pull voltage regulator as a feedback voltage.

The second stage 306 of current mirror amplifiers has a separate biasing transistor 112'. The biasing transistors 112 and 112' determine the current used by the voltage-down regulator 104 and thus the speed of the voltage-down regulator 104. The gate of the biasing transistors 112 and 112' of the voltage-down regulator 104 are coupled to the enable input. Optionally, the biasing transistors 112 and 112' of the voltage-down regulator are biased for high current operation.

The voltage-down regulator 104 uses two current mirror amplifier stages 304 and 306 to achieve high gain. The gate of the biasing transistor 112' for the second current mirror amplifier stage 306 is coupled to the enable input through a plurality of inverter stages 308. The plurality of inverter stages 308 introduces a delay of enable input at the second stage biasing transistor 112' to filter noise and allow time for the output of the first current mirror amplifier stages 304 to settle to a steady state. The voltage-down regulator 104 is activated when the gate of the biasing transistors 112 and 112' receives the enable input.

In another embodiment, the voltage-down regulator 104 includes a plurality of PMOS shorting transistors 312 and 314 equalizing the voltage to the first input and the second input of the second current mirror amplifier stage 306. The plurality of PMOS shorting transistors 312 and 314 are conducting when the enable input is low. When the plurality of PMOS shorting transistors 312 and 314 are conducting, the voltage to the first and second inputs to the second current mirror amplifier stage 306 are set to the same voltage. When the enable input is high, the output from the first current mirror amplifier stage 304 is provided to the input of the second current mirror amplifier stage 306. After the inverter propagation delay, the PMOS shorting transistor 314 of second stage current mirror 306 is turned off and the second current mirror amplifier stage 306 is operational.

In yet another embodiment, the gain amplifier 302 of the voltage-down regulator 104 includes a two input NOR gate and a plurality of inverter stages. The inputs of gain amplifier 306 are the output of inverter 310, which is coupled to the enable input, and the output from the second current mirror amplifier stage 306. The inverter 310 at the input of the gain amplifier 306 serves to delay the activation of the gain amplifier 302 filtering out input noise to gain amplifier 302 and allowing the output from the second current mirror stage 306 to and settle to a steady state. The plurality of inverter stages of the gain amplifier 302 buffer the output from the gain amplifier 302.

The gate terminal of the NMOS drainage transistor 116 is coupled to the output (Vdown) of the gain amplifier 306 of the voltage-down regulator 104. An output terminal of the NMOS drainage transistor 116 is coupled to the output node 126 of the push-pull voltage regulator. The remaining output terminal of the NMOS drainage transistor 116 is coupled to ground. When the NMOS drainage transistor 116 is active, excess charge from the SRAM circuit is transferred to ground 122.

Although a specific transistor configuration was used to illustrate one embodiment of the discharge operation portion 104a of the push-pull voltage regulator, one with skill in the art will appreciate other transistor configurations can be used so long as the essential function of removing excess charge from the SRAM array 120 is maintained.

Figure 4:
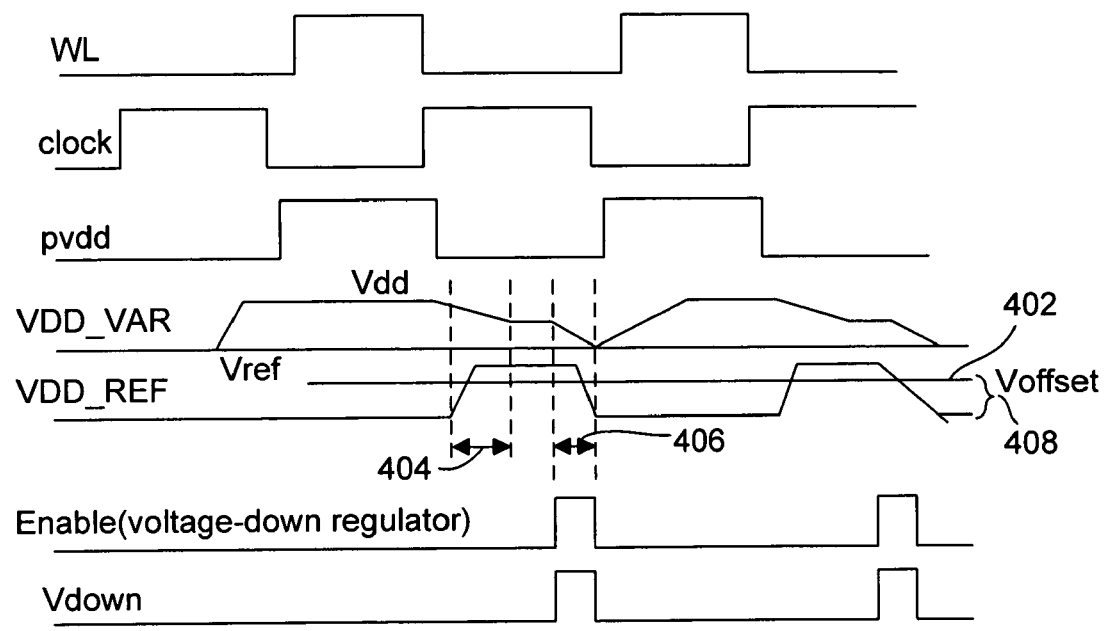
FIG. 4 illustrates an exemplary timing operation of the push-pull voltage regulator in accordance with one embodiment of the present invention.

FIG. 4 illustrates an exemplary timing operation of the push-pull voltage regulator in accordance with one embodiment of the present invention. The voltage (VDD_VAR) of the SRAM array is shown between the output of the high power supply (VDD) and the output of the reference voltage source (Vref). The pvdd input toggles the voltage level switch between providing the output of the high power supply (VDD) and the output of the push-pull voltage regulator (VDD_REF) to the SRAM array. When the pvdd input is high, the output of the high power supply (VDD) is provided to the SRAM array. Conversely, when the pvdd input is low, the voltage level switch provides the output of the push-pull voltage regulator (VDD_REF) to the SRAM array. As the voltage of the SRAM array (VDD_VAR) transitions from high voltage (VDD) to low voltage (VDD_REF), excess charge from the SRAM array should be removed. If excess charge in the SRAM array is not removed, the voltage (VDD_VAR) of the SRAM array will continually increase until the excess charge is removed.

The discharge operation state of the push-pull voltage regulator is triggered when an enable input signal is present on the gate terminal of a biasing transistor of the voltage-down regulator and the voltage (VDD_REF) of the output node of the push-pull voltage regulator is above the threshold voltage 402. The threshold voltage is determined by the output (Vref) of the reference voltage source and output of the offset voltage source (Voffset) 408 and is approximately the sum of these voltages. In one embodiment, the output of the reference voltage source (Vref) is approximately 300 mV and the output of the offset voltage source (Voffset) 408 is approximately 50 mV, resulting in a threshold voltage 402 of approximately 350 mV.

As the voltage of the SRAM array transitions from high voltage (VDD) to low voltage (VDD_REF), the excess charge from the SRAM array needs to be removed. During the time period at the beginning of the precharge cycle 404, if the pvdd input is low, the output node of the push-pull regulator is coupled to the SRAM array through the voltage level switch, transferring excess charge from the SRAM array to the output node of the push-pull voltage regulator. As a result, the voltage (VDD_REF) at the output node of the push-pull voltage regulator increases. At a time toward the end of the precharge cycle 406 of the SRAM array, when the wordline input (WL) is low and the enable input is high, if the voltage (VDD_REF) on the output node of the push-pull regulator is above the threshold voltage, the voltage-down regulator is triggered. The output (Vdown) from the voltage-down regulator turns on the NMOS drainage transistor and excess charge is transferred from the SRAM to ground. The discharge operation state is triggered when the voltage of the output node of the push-pull regulator is higher than the threshold voltage and the enable input is high. As a result, the voltage (VDD_REF) of the output node of the push-pull voltage regulator is brought back to the output (Vref) of the reference voltage source.

Figure 5:
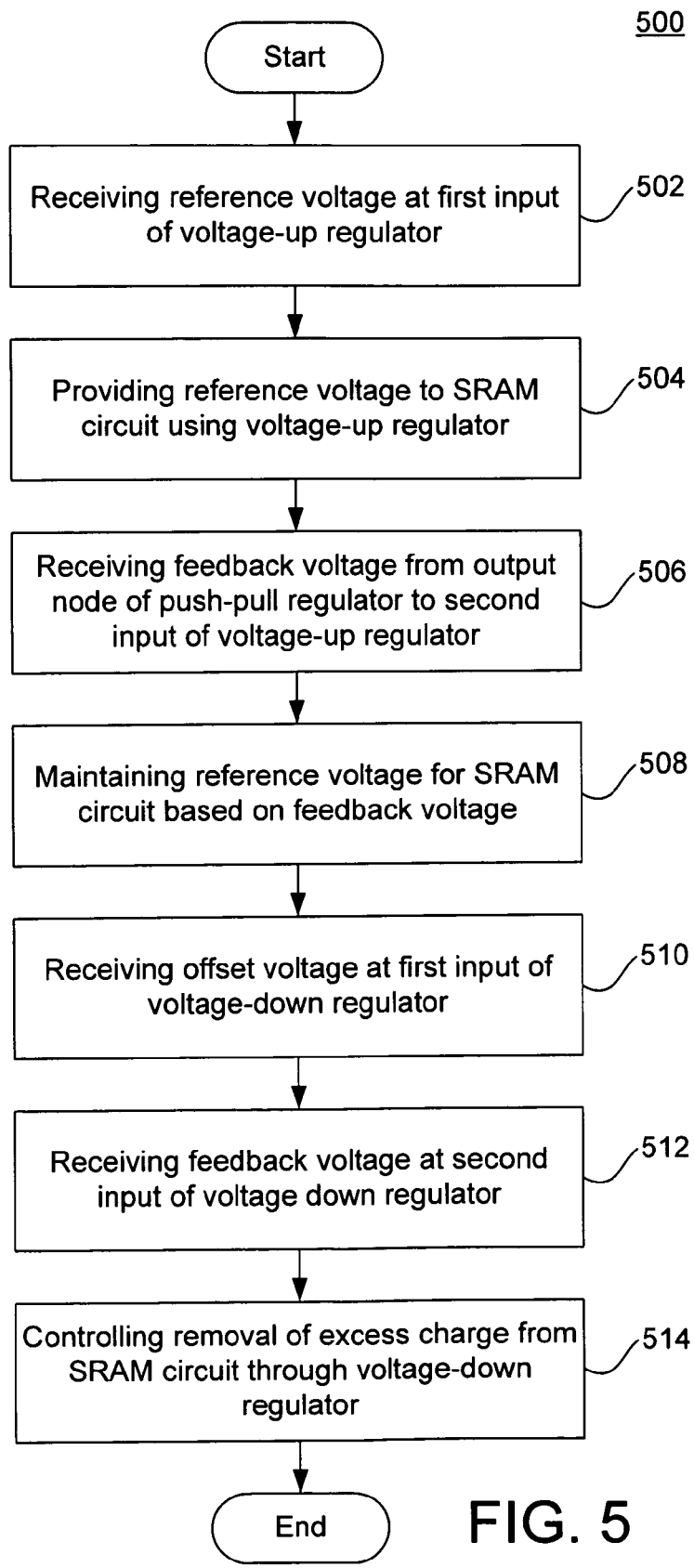
FIG. 5 is a flow chart diagram illustrating method operations for providing the output of a reference voltage source and removing excess charge from an SRAM array, in accordance with one embodiment of the present invention.

FIG. 5 is a flow chart diagram illustrating method operations for providing the output of a reference voltage source and removing excess charge from an SRAM array, in accordance with one embodiment of the present invention. The method 500 begins with operation 502, in which a first input of a voltage-up regulator receives an output (Vref) from the reference voltage source. In one embodiment, the output (Vref) of the reference voltage source provides the low voltage for the SRAM array which operates using both a high voltage (VDD) and a low voltage (VDD_REF). In operation 504, the output (Vref) of the reference voltage source is provided to the SRAM array using the voltage-up regulator. As illustrated in FIG. 1, the output of the voltage-up regulator biases a PMOS passgate transistor to provide the output (Vref) of the reference voltage source to the SRAM array.

The method 500 then advances to operation 506, in which a second input of the voltage-up regulator receives feedback voltage (VDD_REF) from an output node of the push-pull voltage regulator. In operation 508, a voltage regulation state for the SRAM array is maintained using the feedback voltage from the output node of the push-pull voltage regulator. If the voltage (VDD_REF) at the output node of the push-pull voltage regulator is higher than the output (Vref) from the reference voltage source, the voltage-up regulator biases the PMOS passgate to decrease the voltage at the output node of the push-pull voltage regulator. If the voltage (VDD_REF) at the output node of the push-pull voltage regulator is lower than the output (Vref) from the reference voltage source, the voltage-up regulator biases the PMOS passgate to increase the voltage at the output node of the push-pull regulator.

Operation 510 receives an output from an offset voltage source at a first input of a voltage-down regulator. In one embodiment, the offset voltage source in conjunction with the reference voltage source determines a threshold voltages which triggers the discharge operation state of the voltage-down regulator. The method 500 advances to operation 512, in which a second input of the voltage-down regulator receives a feedback voltage (VDD_REF) from the output node of a push-pull voltage regulator. The feedback voltage (VDD_REF) on the first input of the voltage-down regulator is compared with the threshold voltage.

In operation 514, a discharge operation state of the push-pull voltage regulator is controlled through the voltage-down regulator. In one embodiment, the discharge operation state removes excess charge from the SRAM array when the voltage-down regulator receives the enable input signal and the voltage (VDD_REF) of the output node of the push-pull regulator is above the threshold voltage. In yet another embodiment, the voltage on the first input and the second input of a second amplifier stage of the voltage-down regulator is equalized before activation of the voltage-down regulator. Equalization of the voltage on the first input and the second input of the second amplifier stage of the voltage-down regulator prevents noise transfer from a first amplifier stage of the voltage-down regulator.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A push-pull voltage regulator comprising:
   (a) a voltage-up regulator, the voltage-up regulator having a plurality of inputs, an amplifier stage, and a biasing transistor, wherein the voltage-up regulator provides a reference voltage to an SRAM array;
   (b) a voltage-down regulator, wherein the voltage-down regulator controls removal of excess charge from the SRAM array;
   (c) a reference voltage source having an output;
   (d) an offset voltage source having an output coupled between the output of the reference voltage source and an input of the voltage-down regulator;
   (e) an output node of the push-pull voltage regulator coupled to the SRAM array through a voltage level switch; and
   (e) a NMOS drainage transistor, a gate terminal of the NMOS drainage transistor coupled to an output of the voltage-down regulator, a first output terminal of the NMOS drainage transistor coupled to an output node of the push-pull voltage regulator, a second output terminal of the NMOS drainage transistor coupled to ground, wherein the NMOS drainage transistor transfers excess charge from the SRAM array to ground.

2. The push-pull voltage regulator of claim 1, further comprising:
   (f) a PMOS passgate transistor, a gate terminal of the PMOS passgate coupled to an output of the voltage-up regulator, and an output terminal of the PMOS passgate coupled to an output node of the push-pull voltage regulator, wherein biasing the PMOS pass-gate regulates the voltage at the output node of the push-pull voltage regulator.

3. The push-pull voltage regulator of claim 1, further having:
   (i) a voltage regulation state defined to provide the output of the reference voltage source to the SRAM array by the voltage-up regulator; and
   (ii) a discharge operation state defined to selectively remove excess charge from the SRAM array controlled by the voltage-down regulator when the voltage of the output node of the push-pull voltage regulator is above a threshold voltage and the voltage-down regulator receives an input from an enable input, and threshold voltage is determined by the reference voltage source and the offset voltage source.

4. The push-pull voltage regulator of claim 1, wherein the reference voltage source is coupled to a first input of the voltage-up regulator.

5. The push-pull voltage regulator of claim 1, wherein the output node of the push-pull voltage regulator is coupled to a second input of the voltage-up regulator.

6. The push-pull voltage regulator of claim 1, wherein the biasing transistor of the voltage-up regulator biases the voltage-up regulator for low power operation.

7. A voltage-down regulator controlling the removal of excess charge from a SRAM array comprising:
   a plurality of a inputs;
   a plurality of amplifier stages having an output, a first amplifier stage coupled to the plurality of inputs of a second amplifier stage;
   a plurality of PMOS transistors, a first PMOS transistor coupling the plurality of inputs of the second amplifier stage to each other when turned on;
   a plurality of inverters, the propagation delay of the plurality of inverters filters noise on the input of the second amplifier stage;
   a gain amplifier coupled to the plurality of inverters, and the gain amplifier buffering the output of the plurality of amplifier stages;
   an offset voltage source coupled to the plurality of inputs; and
   a biasing transistor, the biasing transistor biases the voltage-down regulator for high current operation.

8. The voltage-down regulator of claim 7, further comprising:
   an enable input coupled to the voltage-down regulator, wherein the enable input activates the voltage-down regulator.

9. The voltage-down regulator of claim 7, wherein a first input is coupled to the offset voltage source.

10. The voltage-down regulator of claim 7, wherein a second input of the voltage-down regulator is coupled to an output node of a push-pull voltage regulator.

11. The gain amplifier of the voltage-down regulator of claim 7, further comprising:
    a two input NOR gate, coupled to the plurality of inverters of the voltage-down regulator; and
    a plurality of inverters, buffering the output of the voltage-down regulator, and providing the output of the voltage-down regulator to a gate of a NMOS drainage transistor.

12. A method of voltage regulation and removing excess charge from an SRAM array comprising:
    receiving an output of a reference voltage source at a first input of a voltage-up regulator;
    providing the output of the reference voltage source to an SRAM array using the voltage-up regulator;
    receiving feedback voltage at a second input of the voltage-up regulator from an output node of a push-pull voltage regulator;
    maintaining a voltage regulation state for the SRAM array using feedback voltage from the output node of the push-pull voltage regulator;
    receiving an output from an offset voltage source at a first input of a voltage-down regulator;
    receiving feedback voltage at a second input of the voltage-down regulator from the output node of the push-pull voltage regulator; and
    controlling a discharge operation state of the push-pull voltage regulator through the voltage-down regulator.

13. The method of voltage regulation of claim 12, further comprising:
    triggering the discharge operation state of the push-pull voltage regulator when the voltage-down regulator receives an enable input signal and the voltage of the output node of the push-pull voltage regulator is above a threshold voltage.

14. The method of voltage regulation of claim 13, further comprising:
    determining the threshold voltage using the output of the reference voltage source and an output of the offset voltage source.

15. The method of voltage regulation of claim 12, wherein an output of a high power supply is higher than the output of the reference voltage source.

16. The method of voltage regulation of claim 12, further comprising:
    transmitting an output of the voltage-down regulator to a gate of a NMOS drainage transistor;
    turning on the NMOS drainage transistor, a first output terminal of the NMOS drainage transistor coupled to the output node of the push-pull voltage regulator, a second output terminal of the NMOS drainage transistor coupled to ground; and
    removing excess charge from the SRAM array through the NMOS drainage transistor.

17. The method of voltage regulation of claim 12, further comprising:
    biasing the gate terminal of the biasing transistor of the voltage-up regulator for low current operation.

18. The method of voltage regulation of claim 12, further comprising:
    biasing the gate terminal of the biasing transistor of the voltage-down regulator for high current operation.

19. The method of voltage regulation of claim 12, further comprising:
    continually providing the output of the reference voltage source to a voltage level switch.

20. The method of voltage regulation of claim 12, further comprising:
    equalizing a voltage a first input and a second input of a second amplifier stage of the voltage-down regulator before activation of the voltage-down regulator, wherein equalization of the first input and the second input of the second amplifier stage of the voltage-down regulator prevents noise transfer from a first amplifier stage of the voltage-down regulator.

\* \* \* \* \*